United States Patent [19]
Reed

[11] 3,944,943
[45] Mar. 16, 1976

[54] BROADBAND AMPLIFIER

[75] Inventor: Frederick Frank Reed, El Paso, Tex.

[73] Assignee: GTE Sylvania Incorporated, Stamford, Conn.

[22] Filed: Nov. 29, 1974

[21] Appl. No.: 528,337

[52] U.S. Cl. .................... 330/109; 330/21; 330/29; 330/31; 330/107; 3,023,369/02001962
[51] Int. Cl.² .......................................... H03F 1/36
[58] Field of Search .......... 330/21, 31, 107, 109, 29

[56] References Cited
UNITED STATES PATENTS

| | | | |
|---|---|---|---|
| 3,023,369 | 2/1962 | Horowitz | 330/24 |
| 3,281,708 | 10/1966 | Rogers et al. | 330/154 |
| 3,418,591 | 12/1968 | Fisher | 330/109 X |
| 3,451,003 | 6/1969 | Rheinfelder | 330/21 |
| 3,699,465 | 10/1972 | Pranke | 330/15 |
| 3,781,703 | 12/1973 | Duty | 330/52 |

FOREIGN PATENTS OR APPLICATIONS

| | | | |
|---|---|---|---|
| 247,079 | 9/1963 | Australia | 330/31 X |

OTHER PUBLICATIONS

Burrows, B.C.J.–"Ceramic Pickups and Transistor Pre-Amplifiers."–*Wireless World* pp. 56–60, Feb. 1970.

*Primary Examiner*—R. V. Rolinec
*Assistant Examiner*—Lawrence J. Dahl
*Attorney, Agent, or Firm*—Norman J. O'Malley; Robert E. Walrath; Robert T. Orner

[57] ABSTRACT

A broadband amplifier with a negative feedback circuit having a variable resistance means and first and second parallel resistor-inductor combinations for slope control is shown. The variable resistance means establishes the overall frequency response and can be electronically varied to provide automatic gain control. The first and second parallel resistor-inductor combinations provide compensation for deviations from the desired frequency response over respective first and second frequency ranges.

12 Claims, 4 Drawing Figures

BROADBAND AMPLIFIER

FIELD OF THE INVENTION

This invention relates to broadband amplifiers and more particularly to broadband amplifiers with slope control capable of providing a flat overall frequency response when cascaded with transmission mediums of various lengths or attenuation values.

BACKGROUND OF THE INVENTION

In signal transmission systems for transmitting or distributing signals within a broad range of frequencies, broadband amplifiers are commonly used to compensate for attenuation of the signals in the transmission medium. For example, in systems wherein the transmission medium is coaxial cable, the transmitted or distributed signals are attenuated by the cable with the amount of attenuation generally dependent upon the length of the cable. The attenuation of coaxial cable is also frequency dependent so that different frequencies are attenuated by different amounts. Signal attenuation as a function of frequency for coaxial cables is typically of the form $A=K\sqrt{f}$, where f is the frequency and K is a constant depending upon the cable type and overall length.

Typical broadband amplifiers for amplifying the signals transmitted via a coaxial cable accordingly provide an overall gain to compensate for the attenuation. The gain of the amplifier is typically divided into two parts called level compensation and slope compensation. For level compensation the signals are amplified by an amount equal to the attenuation without compensating for the frequency dependency of the attenuation. For slope compensation the frequency characteristic of the amplifier is tilted so that the gain is proportional to the square root of frequency to amplify higher frequencies more than lower frequencies.

In prior art broadband amplifiers using transistors, negative feedback from the collector to the base of the transistor provides an amplifier with a gain that tracks the square root of frequency response over a substantial frequency range to a reasonable approximation. Since a given amplifier may be required to compensate for attenuation by any one of a variety of different coaxial cables and cables of varying lengths, a common prior art practice is to provide a manually adjustable feedback for set-up.

While manual set-up provides a certain measure of flexibility, the attenuation of coaxial cable is also dependent upon changing environmental and atmospheric conditions. For example, higher temperatures typically cause increased attenuation. Accordingly, a common prior art practice is to provide automatic gain control to compensate for these varying conditions. U.S. Pat. No. 3,717,813 to D. Lieberman and R. E. Neuber discloses a modular amplifier station with a provision for automatic gain control to control both level and slope. U.S. Pat. No. 3,800,240 to M. Zelenz discloses circuitry for filtering and amplifying pilot signals used for automatic gain control in a broadband amplifier system. In addition, U.S. Pat. No. 3,755,737 to T. S. Eller discloses an automatic gain control system wherein a plurality of pilot signals of off-set frequencies are used for automatic gain control of return amplifiers. In general, level and slope control signals can be developed from either one or two pilot signals included in the transmitted signals. Other forms of automatic gain control are also known in the prior art.

A particularly troublesome and long-standing problem in the prior art has been providing broadband amplifiers of sufficient bandwidth to cover the frequency range desired. In community antenna television (CATV) systems, the frequency response error generally must be limited to ±0.1 dB over the frequency range of interest. With typical prior art broadband amplifiers using the above-mentioned negative feedback, several significant limitations are encountered. For example, in a CATV system with sub-VHF signal channels for the reverse or return direction, the range of cable attenuation values for which the prior art amplifiers provide a flat frequency response, using the ±0.1 dB limiting criterion, is generally restricted to cable lengths providing up to 5 dB attenuation at 30 mHz thereby necessitating additional amplifiers to maintain signal levels. Also, the frequency range over which the amplifier will track the cable within the ±0.1 dB limits is typically 10 mHz to 35 mHz. Attempts to extend the frequency range in the sub-VHF band to encompass lower frequencies have generally resulted in unsatisfactory performance because prior art broadband amplifiers of the type described do not provide a sufficiently flat response at the lower frequencies.

OBJECTS OF THE INVENTION

Accordingly, it is a primary object of this invention to provide a broadband amplifier which obviates the above-noted and other disadvantages of the prior art.

It is a further object of this invention to provide a broadband amplifier which possesses an extended frequency capability.

It is a further object of this invention to provide a broadband amplifier which provides a flat frequency response when cascaded with a transmission medium.

It is a still further object of this invention to provide a broadband amplifier which possesses an extended gain range capability.

It is a yet further object of this invention to provide a broadband amplifier which possesses an extended low frequency capability.

SUMMARY OF THE INVENTION

The above and other objects and advantages are achieved in one aspect of this invention in a broadband amplifier having a negative feedback path from the collector to the base of a transistor.

The negative feedback path includes a series connection of a resistive means and a first parallel combination of a first resistor and a first inductor which provides the amplifier with a gain approximately proportional to the square root of frequency. The improvement comprises a second parallel combination of a second resistor and a second inductor connected in series with the first parallel combination in the negative feedback path. The second parallel combination has a resistance-to-inductance ratio lower than the ratio of the first parallel combination.

The above and other advantages are achieved in another aspect of this invention in a broadband amplifier for amplifying signals in a predetermined range of frequencies coupled thereto via a segment of coaxial cable. The broadband amplifier includes an amplifier which has a gain for substantially compensating for the attenuation of the signals by the coaxial cable as a function of frequency. The amplifier includes a transistor and a negative feedback path defined by a resistive means and a parallel combination of a first inductance means and first resistor connected in series with the resistive means. The improvement comprises a parallel combination of a second inductance means and a second resistor connected in series with the resistive means for compensating for deviations from the desired frequency response in a range of frequencies less than a predetermined frequency.

DETAILED DESCRIPTION OF THE PREFERRED EMBODIMENT

For a better understanding of the present invention, together with other and further objects, advantages and capabilities thereof, reference is made to the following disclosure in conjunction with the accompanying drawings.

Figure 1:
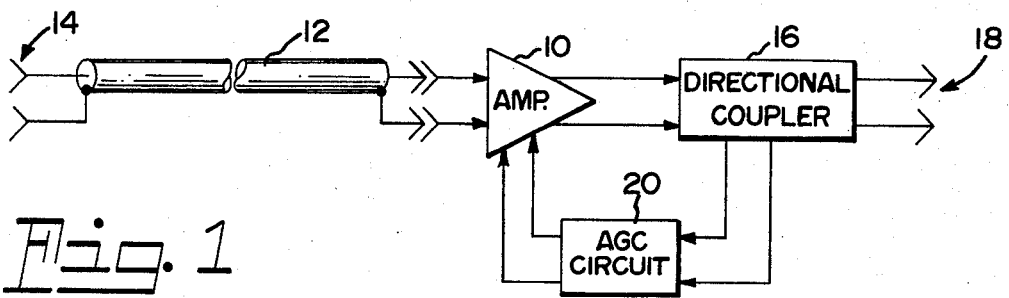
FIG. 1 is a block diagram of a broadband amplifier in which the invention finds utility.

In FIG. 1 a broadband amplifier 10 receives signals in a predetermined range of frequencies via a transmission medium illustrated as a segment of coaxial cable 12 to compensate for the attenuation of the signals by coaxial cable 12. Input signals are coupled to coaxial cable 12 by an input means 14 which can be connected to, for example, another broadband amplifier similar to that illustrated herein. Output signals from amplifier 10 are connected to a directional coupler 16 which provides output signals to output terminals 18 which can be coupled to another segment of coaxial cable similar to segment 12. Directional coupler 16 also couples at least a portion of the signal energy of one or more signals from amplifier 10 to an automatic gain control (AGC) circuit 20 which develops one or more gain control signals to control the level and slope of the frequency response of amplifier 10. In those applications where AGC is not desired, directional coupler 16 and AGC circuit 20 can be deleted. In such applications, the output of amplifier 10 is directly coupled to output terminals 18.

Figure 2:
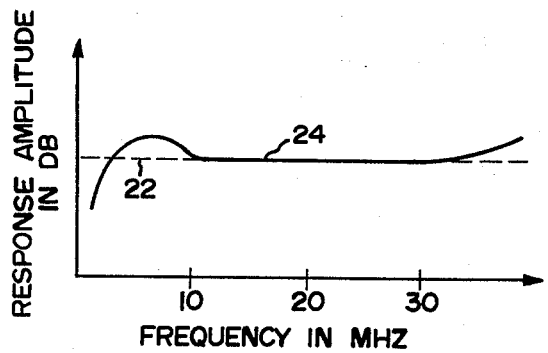
FIG. 2 is a graph of the response amplitude versus frequency of a typical prior art broadband amplifier.

In operation, amplifier 10 has a frequency response complimentary to the attenuation of cable segment 12 cascaded therewith so that an overall flat frequency response is obtained. In typical CATV systems the overall frequency response is required to be within ±0.1 dB of the desired response at all frequencies within the frequency range of interest. In FIG. 2 a graph of response amplitude in dB versus frequency in mHz for a typical coaxial cable and broadband amplifier in cascade is illustrated. The desired response is represented by dashed line 22 while the actual response is represented by solid line 24. Lines 22 and 24 generally coincide over the frequency range 10 mHz to 35 mHz. Outside of those limits the actual response deviates from the desired response so that, considering normal tolerances, unacceptable performance is obtained.

It should be noted that the frequencies used in the example illustrated in FIG. 2 are in a sub-VHF band commonly used for return signals in bi-directional CATV systems. Those skilled in the art will realize, however, that the invention described herein is applicable to other frequency ranges. Accordingly, while a particular embodiment for a particular frequency range is described, the invention is not so limited.

Figure 3:
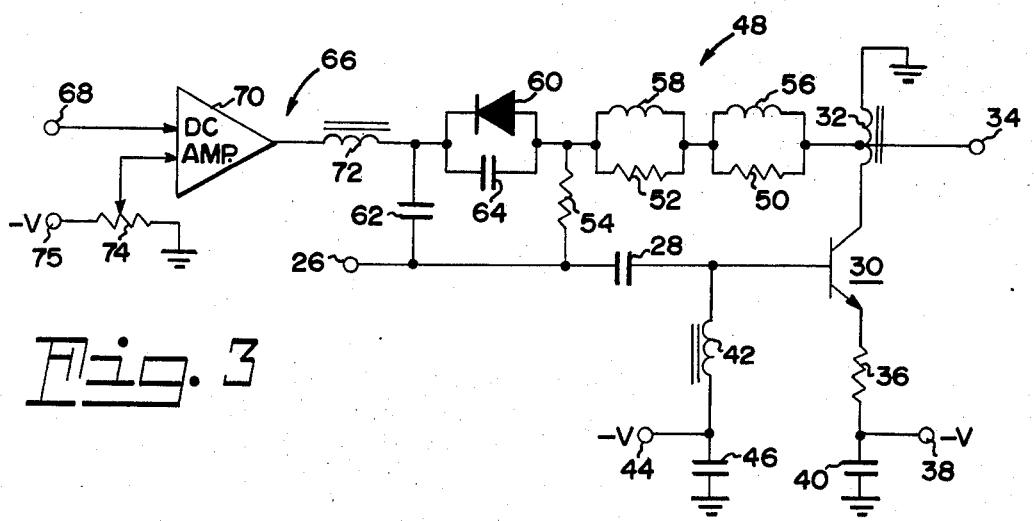
FIG. 3 is a schematic diagram of one embodiment of the invention.

In FIG. 3 the preferred embodiment of the invention is illustrated schematically. Typically, the circuit of FIG. 3 will be included as one amplifier stage of a broadband amplifier such as amplifier 10 of FIG. 1. In FIG. 3 an input terminal 26 is connected by a coupling capacitor 28 to a base of a transistor 30. Transistor 30 has a collector connected by an autotransformer 32 to one terminal of a source of energizing potential illustrated as circuit ground. A tap on transformer 32 is connected to an output terminal 34. An emitter of transistor 30 is connected by a resistor 36 to the other terminal of a source of energizing potential 38 which is further connected by a decoupling capacitor 40 to circuit ground. The base of transistor 30 is connected by an RF choke 42 to a terminal of a source of energizing potential 44 which is further connected by a decoupling capacitor 46 to circuit ground.

In operation, signals applied to input terminal 26 are coupled via capacitor 28 to the base of transistor 30 which amplifies the signals and couples the amplified signals to output terminal 34. Input terminal 26 can be coupled to the output terminal of a preceeding amplifier stage while output terminal 34 can be coupled to the input terminal of a succeeding amplifier stage. Transformer 32 and resistor 36 determine the gain, input impedance, and output impedance of the amplifier stage. The gain, however, is modified by negative feedback provided through a negative feedback path 48 from the collector to the base of transistor 30 which primarily determines the frequency response of the amplifier stage.

Negative feedback path 48 includes series connected resistors 50, 52, and 54 connected between the tap on transformer 32 and the junction of input terminal 26 and capacitor 28. An inductance means illustrated as an inductor or coil 56 is connected in parallel with resistor 50 while an inductance means illustrated as an inductor or coil 58 is connected in parallel with resistor 52. A variable resistance means illustrated as a diode 60 has an anode connected to one end of resistor 54 and a cathode connected by a coupling capacitor 62 to the other end of resistor 54 thereby effectively connecting diode 60 in parallel with resistor 54. A capacitor 64 is connected in parallel with diode 60.

A means for biasing diode 60 at an operating point, illustrated as a part of an AGC circuit 66, is connected to the junction between diode 60 and capacitor 62. A terminal 68 is connected to one input of a DC amplifier 70 which has an output connected by an RF choke 72 to the junction of diode 60 and capacitor 62. The other input of amplifier 70 is connected to the tap on a potentiometer 74 which has a resistance element connected between a source of energizing potential illustrated as a terminal 75 and circuit ground.

A negative feedback path from the collector to the base of a transistor including a parallel combination of a resistor and an inductor connected in series with a resistive means tracks the square root of frequency response over a substantial frequency range to a reasonable approximation. Accordingly, the parallel combination of resistor 52 and inductor 58 connected in series with a resistive means including resistor 54 are connected to provide a negative feedback path. The resistive means including resistor 54 also includes diode 60 which in the preferred embodiment is a PIN diode. At radio frequencies a PIN diode is essentially a current-controlled resistor and can be viewed as such when considering the circuit operation. Accordingly, diode 60 is resistive at radio frequencies. Capacitor 62 is a coupling capacitor at radio frequencies and blocks DC bias currents. When the current through diode 60 is zero, its RF resistance is high and can be, for example, on the order of 10,000 ohms. Preferably, the resistance of resistor 54 is substantially less than the zero current resistance of diode 60 so that the effect of diode 60 in parallel with resistor 54 is negligible at zero current and resistor 54 predominates in feedback path 48 to establish the limiting frequency response or gain of the amplifier. This operating condition is illustrated in FIG. 4 by line or curve 76 which represents the gain of the amplifier stage as a function of the square root of frequency at zero current through diode 60.

As the current through diode 60 increases, its resistance decreases to decrease the total resistance in negative feedback path 48 to thereby increase the feedback and decrease the gain of the amplifier. The gain of the amplifier is modified as a function of frequency, however, by the parallel combination of resistor 52 and inductor 58. At lower frequencies the impedance of inductor 58 is lower relative to the resistance of resistor 52 so that a greater negative feedback and hence lower gain is provided at those frequencies. At higher frequencies the impedance of inductor 58 increases to increase the effect of resistor 52 in parallel therewith and decrease the negative feedback. As the current therethrough increases, the impedance or RF resistance of diode 60 decreases so that the total resistance of the resistive means including diode 60 and resistor 54 decreases. At a particular forward current through diode 60, curve 78 in FIG. 4 is obtained. At an even higher forward current through diode 60, curve 80 is obtained. Accordingly, FIG. 4 is a graph of a family of curves which is obtained by varying the current through diode 60. Capacitor 64 in parallel with diode 60 is a small compensation capacitor with a high impedance at the frequencies of interest. Capacitor 64 has a substantial effect when the current through diode 60 is low and the impedance thereof is high. At low currents through diode 60, capacitor 64 tends to flatten the frequency response and compensates for the slight effects of inductors 56 and 58. As the current through diode 60 increases, its RF resistance decreases and the effect of capacitor 64 correspondingly decreases.

Figure 4:
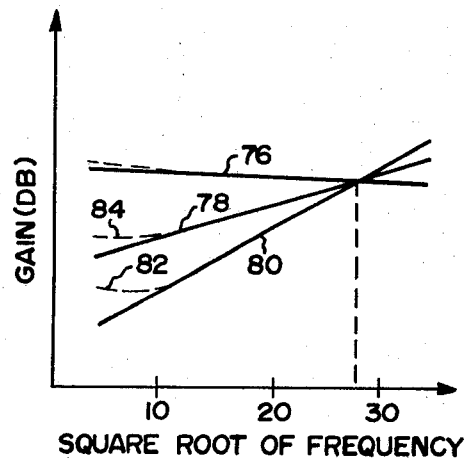
FIG. 4 is a graph of gain versus frequency to aid in the explanation of the invention.

It should be noted that the curves of FIG. 4 tend to pivot about a frequency $f_1$ which can be called a pivot point. The magnitude of the gain of the amplifier of FIG. 3 remains substantially constant at frequency $f_1$ when the feedback in feedback path 48 is varied. Referring to FIG. 1, broadband amplifier 10 is preferably a multi-stage amplifier wherein the slope controlled amplifier of FIG. 3 comprises one stage and a level controlled stage comprises another stage. In other words, the level controlled stage shifts the family of curves of FIG. 4 upward or downward when considered in combination with the slope controlled stage of FIG. 3.

The particular one of the family of curves of FIG. 4 selected for operation is determined primarily by the characteristics of coaxial cable segment 12. The current through diode 60 is determined during set-up which can be accomplished by adjusting potentiometer 74 so that amplifier 70 provides the desired bias current through diode 60. During operation of the amplifier in the AGC mode, a slope control voltage is applied to terminal 68 to cause amplifier 70 to vary the current through diode 60 thereby altering the slope of the frequency response of the amplifier.

In typical CATV systems some amplifiers will include AGC while others will have a fixed gain. In those versions where a fixed gain is used, amplifier 70 can be eliminated and the bias current through diode 60 can be determined by a variable set-up bias. Also, in those versions which do not include AGC, diode 60 can be replaced by a manually variable resistance.

While the above-described compensation has been used in the prior art, it has been found that the frequency response deviates from the desired response particularly at lower frequencies and particularly for higher values of cable attenuation. This deviation is illustrated in FIG. 2 by the deviation of the actual response 24 from the desired response 22 and in FIG. 4 by dashed lines 82 and 84 which deviate from the desired response at frequencies less than about 10 mHz.

The parallel combination of resistor 50 and inductor 56 in feedback path 48 compensate for the deviation illustrated by dashed lines 82 and 84 of FIG. 4. Preferably, resistor 50 has a resistance much lower than the resistance of resistor 52 and resistor 50 and inductor 56 have a low resistance-to-inductance ratio as compared to the parallel combination of resistor 52 and inductor 58 in order to limit the effects of the parallel combination of resistor 50 and inductor 56 to the low frequencies of the frequency range of interest. In operation, at low frequencies the impedance of inductor 56 increases the negative feedback, while at higher frequencies, the parallel combination of resistor 50 and inductor 56 "looks" resistive.

Accordingly, there has been illustrated and described a broadband amplifier with an extended frequency range and gain capability. The frequency range is extended particularly to lower frequencies thereby permitting a broader range of frequencies to be amplified satisfactorily. In one particular embodiment the operating frequency range was extended to include the range from 10 mHz to 6 mHz while the cable attenuation for which the amplifier satisfactorily compensated was increased to 9 dB at 30 mHz.

While there has been shown and described what is at present considered the preferred embodiment of the invention it will be obvious to those skilled in the art that various changes and modifications may be made therein without departing from the invention as defined by the appended claims.

What is claimed is:

1. A broadband amplifier having a negative feedback path from the collector to the base of a transistor including a series connection of a resistive means and a first parallel combination of a first resistor and first inductor for providing the amplifier with a gain approximately proportional to the square root of frequency, the improvement comprising a second parallel combination of a second resistor and a second inductor connected in series with said first parallel combination in said negative feedback path, said second parallel combination having a resistance-to-inductance ratio lower than the ratio of said first parallel combination.

2. A broadband amplifier as defined in claim 1 wherein said second resistor has a resistance substantially less than the resistance of said first resistor.

3. A broadband amplifier as defined in claim 2 wherein the operating bandwidth of the amplifier is at least 6 mega-Hertz to 30 mega-Hertz and said second parallel combination compensates for deviations of the gain from the square root of frequency in the operating frequency range less than approximately 10 mega-Hertz.

4. A broadband amplifier as defined in claim 1 wherein said resistive means includes a resistor and a variable resistance means connected in parallel.

5. A broadband amplifier as defined in claim 4 wherein said variable resistance means includes a diode and means for biasing said diode at an operating point.

6. In a broadband amplifier for amplifying signals in a predetermined range of frequencies coupled thereto via a segment of coaxial cable, an amplifier with a gain for substantially compensating for the attenuation of said signals by said coaxial cable as a function of frequency, said amplifier including a transistor and a negative feedback path defined by a resistive means and a parallel combination of a first inductance means and first resistor connected in series with said resistive means, the improvement comprising a parallel combination of a second inductance means and second resistor connected in series with said resistive means for compensating for deviations from the desired frequency response in a range of frequencies less than a predetermined frequency.

7. An amplifier as defined in claim 6 wherein said first and second inductance means comprise first and second inductors, respectively, and the resistance-to-inductance ratio of said second resistor and second inductor is lower than the ratio of said first resistor and first inductor.

8. An amplifier as defined in claim 7 wherein said second resistor has a resistance substantially less than the resistance of said first resistor.

9. An amplifier as defined in claim 7 wherein the range of frequencies of said signals is at least 6 mega-Hertz to 30 mega-Hertz and said second resistor and second inductor compensate for deviations from the desired frequency response in the range of frequencies less than 10 mega-Hertz.

10. An amplifier as defined in claim 6 wherein said resistive means includes a third resistor connected in series with said first and second resistors and a variable resistance means connected in parallel with said third resistor.

11. An amplifier as defined in claim 10 wherein said variable resistance means includes a diode and means for biasing said diode at an operating point.

12. An amplifier as defined in claim 11 wherein said means for biasing includes means for developing an automatic gain control voltage dependent on the amplitude of a signal coupled via said segment of coaxial cable.

* * * * *